United States Patent [19]

Hultin

[11] Patent Number: 4,845,427
[45] Date of Patent: Jul. 4, 1989

[54] ARRANGEMENT FOR THE MEASUREMENT OF ELECTRONIC UNITS

[76] Inventor: Leino Hultin, Häggvägen 4, S-435 00 Mölnlycke, Sweden

[21] Appl. No.: 914,826
[22] PCT Filed: Feb. 3, 1986
[86] PCT No.: PCT/SE86/00041
§ 371 Date: Sep. 26, 1986
§ 102(e) Date: Sep. 26, 1986
[87] PCT Pub. No.: WO86/04685
PCT Pub. Date: Aug. 14, 1986

[30] Foreign Application Priority Data

Feb. 4, 1985 [SE] Sweden ............... 8500476

[51] Int. Cl.⁴ ............... G01R 1/04; G01R 1/073
[52] U.S. Cl. ............... 324/158 P; 324/72.5; 324/158 F; 414/7
[58] Field of Search ............ 324/72.5, 73 PC, 158 P, 324/158 F; 414/7; 198/468.4; 901/14, 15, 28, 44

[56] References Cited

U.S. PATENT DOCUMENTS

| | | | |
|---|---|---|---|
| 1,910,827 | 5/1933 | Fedstoff | 324/72.5 |
| 3,284,964 | 11/1966 | Saito | 414/7 |
| 4,061,969 | 12/1977 | Dean | 324/158 F |
| 4,621,965 | 11/1986 | Wilcock | 414/7 |
| 4,625,164 | 11/1986 | Golder et al. | 324/158 F |

FOREIGN PATENT DOCUMENTS

| | | | |
|---|---|---|---|
| 2085185 | 1/1970 | France | 901/44 |
| 2538554 | 6/1984 | France | 324/158 P |

OTHER PUBLICATIONS

"Wafer Handling Fixture", by Slayton, IBM Tech. Disc. Bull., vol. 11, #7, 12/68, p. 863.
"Chip Alignment Probe", by Chizu et al., IBM Tech. Disc. Bull., vol. 12, #10, 3/70, p. 1547.

Primary Examiner—Reinhard J. Eisenzopf
Assistant Examiner—W. Burns

[57] ABSTRACT

An arrangement for the measurement of electronic units with a large number of connection points situated close to one another and constituting points of measurement, as in integrated circuits. The arrangement comprises a measuring device (1) with at least one fastening member by means of which the arrangement is secured to the electronic unit in a specific, fixed position. Spring-loaded contact elements (2) provided on the measuring device are so arranged as to come into electrical contact with measurement points on the electronic unit. The positioning of the contact elements on the measuring device forms a pre-determined pattern which matches directly the measurement points on the electronic unit. The fastening member is provided with a recess. The aforementioned recess is connected, via a preferably elongated, tubular and flexible element (19), to an air suction arrangement. The aforementioned electronic unit can be secured in the recess by means of negative pressure which is produced by means of the air suction arrangement when the electronic unit is fitted into the recess. The spring-loaded contact elements (2) are in electrical contact, preferably via an adapter circuit, with measurement instruments which may be of a previously disclosed type.

2 Claims, 2 Drawing Sheets

ARRANGEMENT FOR THE MEASUREMENT OF ELECTRONIC UNITS

TECHNICAL FIELD

The present invention relates to an arrangement for the measurement of electronic units with a large number of connection points situated close to one another, as in the case of boards with integrated circuits.

For the conventional fault locating and testing of integrated circuits provided with connection leads and installed inside a housing or directly on a board, use is made at the present time of measuring probes which are connected to an oscilloscope on which can be read the signal levels for the test object.

TECHNICAL PROBLEM

In order to hold the housing or possibly a small circuit board in position for measurement in the probe, the use of a mechanical fixture is familiar. As a result of this probe is of large format, and only one measurement at a time can be performed on the same circuit board.

The aforementioned method is beset with major technical problems when testing circuit boards with high integrated density due to the fact that the distance between the connection leads of the board is very small, as a result of which it is difficult to connect the board to the measurement equipment. The method is very time-consuming because of the need to observe great accuracy during the measurement in order for correct connection to be achieved and for it to be possible for short-circuiting to be avoided, with measurement being possible at only one point of measurement at a time. The available equipment for measurement purposes cannot be regarded as being suited to its intended use.

THE SOLUTION

The arrangement in accordance with the invention comprises a measuring device with a fastening member by means of which the arrangement is secured to the electronic unit in a specific, fixed position, in conjunction with which spring-loaded contact elements provided on the measurement device are so arranged as to come into electrical contact with measuring points on the electronic unit. The fastening member is provided with a recess which is connected via an elongated, tubular and flexible element to an air suction arrangement, such that the electronic unit can be secured in the recess by means of negative pressure which is produced by means of the air suction unit when the electronic unit is fitted into the recess. The spring-loaded contact elements are in electrical contact with measuring instruments which may be of a previously disclosed type.

ADVANTAGES

Obtained through the invention is an arrangement for the measurement of signal levels in electronic units, such as in integrated circuit boards, for both fault locating and for manufacturing inspection purposes, which is of small format and which eliminates the aforementioned problems by the unit being capable of being connected at all its points of measurement in a single operation.

The aforementioned object is achieved by means of an arrangement in accordance with the characterizing part of Patent Claim 1 following.

DESCRIPTION OF THE DRAWINGS

The invention is described below in greater detail in relation to an illustrative embodiment with reference to the accompanying drawings, in which.

PREFERRED EMBODIMENT

Figure 1:
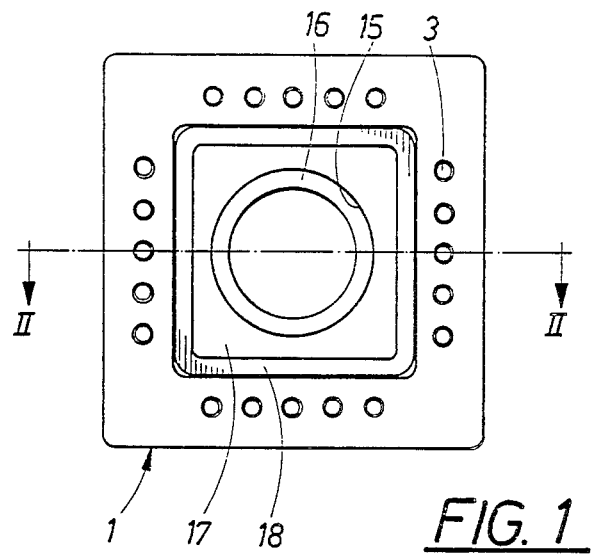
FIG. 1 shows a view from above of the arrangement.
Figure 2:
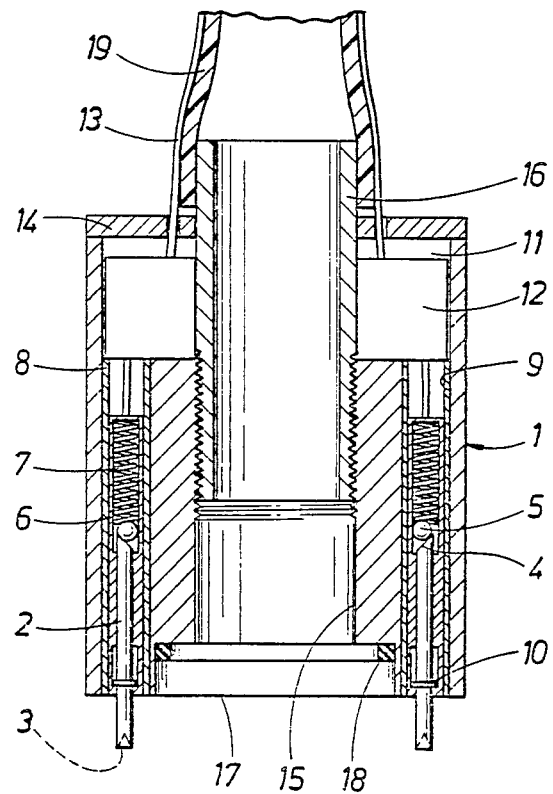
FIG. 2 shows a section along line II—II in FIG. 1.

As can be appreciated from FIG. 2, the arrangement in accordance with the invention constitutes a measuring probe comprising a holder 1, preferably made of a plastics material such as plexiglass, said holder exhibiting measuring pins 2, the one end parts of which are provided with conical recesses 3. The measuring pins also exhibit at their other end part oblique end surfaces 4 set at an angle of about 45° in relation to their longitudinal direction. The measuring pins are flexibly arranged in sleeves 6 by means of springs 7, preferably helical springs, which are in contact with one end part against balls 5 which are forced by the pressure of the spring against the respective end surfaces 4 of the pins 2. The sleeves are arranged inside cylinders 8, which in turn are inserted into holes 9 in the holder 1. Each of the measuring pins 2 is in contact with the outer, inward-flanged end part of the cylinder with a shoulder 10 arranged on the pin, said shoulders appropriately being constituted by a small flange. The opposite, inner end parts of the cylinders are attached to an interchangeable adapter circuit 12 fitted in a recess 11, to which circuit a number of electrical cables 13 corresponding to the number of measuring pins are attached. The adapter circuit is held in position by a cover 14. The size of the holder and the number of the measuring pins 2 match the size of the principal type of electronic component which shall be capable of being measured. In the illustrative embodiment the holder is provided with twenty measuring pins, to which correspond twenty points of measurement on the component. The pins are divided up into four groups which form a square. The measuring pins with their associated sleeves, cylinders and balls are all manufactured from electrically conductive material of low resistance.

The holder 1 exhibits a centrally arranged hole 15 in which a tube 16 is positioned. The hole opens into a recess 17 around the wall part of which a sealing ring 18 is fitted, said ring being made of a flexible material, preferably rubber. To the part of the tube which projects from the cover is fitted an airtight hose 19 of about 20 cm in length and made of a flexible material, to which the electrical cables 13 are attached in order to provide them with support.

Figure 3:
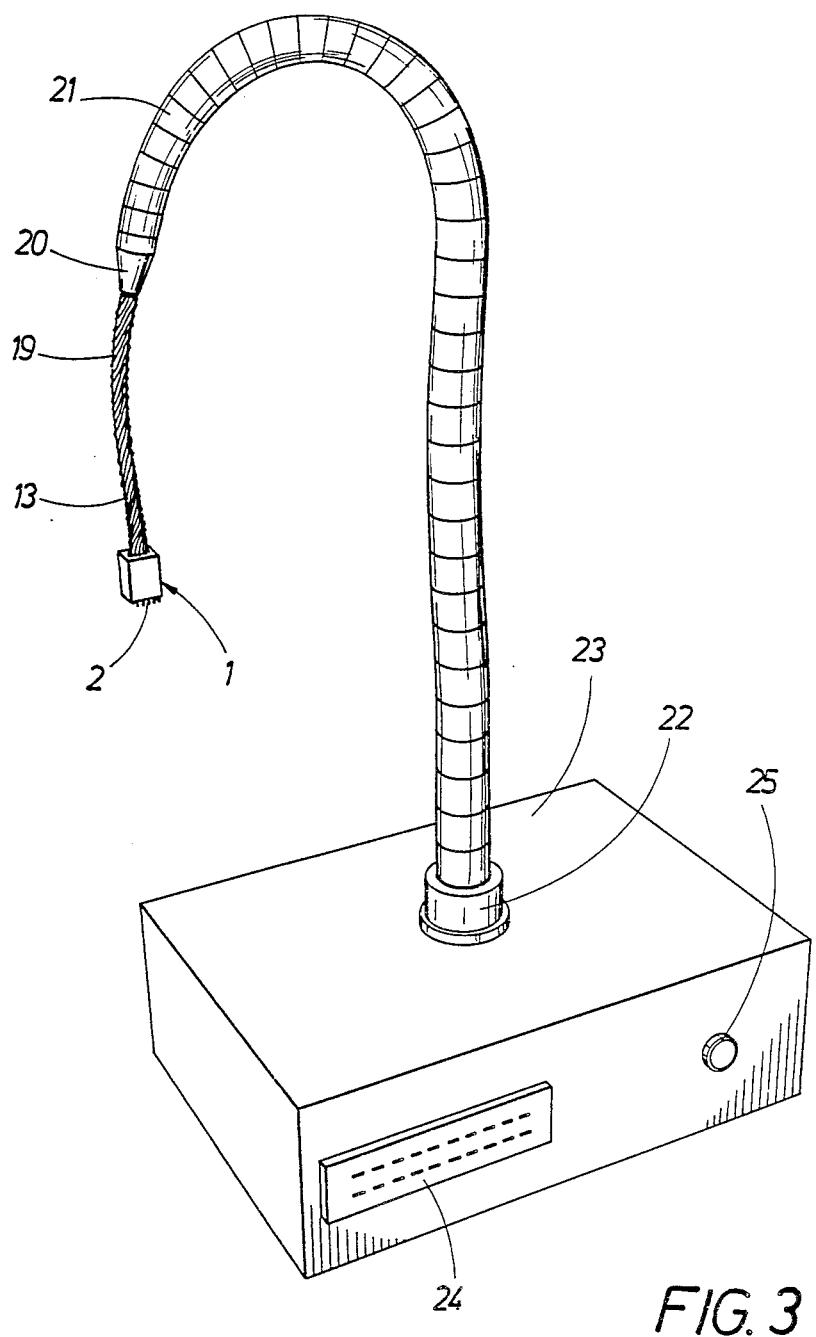
FIG. 3 shows a perspective view of the arrangement with its associated connection box.

As illustrated in FIG. 3, the hose and the cables are passed through a sleeve 20 situated at a distance from the holder and attached to an articulated arm 21. The arm in accordance with the illustrative embodiment is constructed from a number of previously disclosed articulated component parts which exhibit the form of a hollow cone, the apex of which is transformed into a spherical part. The component parts are connected to one another by the base of the core being attached outside the spherical part of the following articulated component part, in this way forming the elongated, hollow and articulated arm. The articulated arm is executed in such a way that it is able to be swung through 360° and to be bent in all directions. The arm is removably attached by means of a fastening element 22 to a connection box 23 exhibiting the necessary contact device 24 for connection to various measuring instruments and a coupling 25 for a vacuum line. Each of the contact devices 24 is connected to one of the conductors in the respective cables 13. The line coupling 25 is attached so as to provide air extraction via the hose 19. It is also conceivable to connect a number of arms to the box, in which case the size of the box should preferably be increased.

The extraction of the air takes place by means of a vacuum pump of a previously disclosed type, which is attached via the coupling 25 to the connection box 23 to which the arm 21 is attached so that an entirely tight airway is provided and a vacuum can be formed in the recess 17. The vacuum pump can be connected in this way to a number of different connection boxes, thereby reducing the cost of the installation. Some form of mesh should suitably be fitted to the end of the tube 7 adjacent to the hole, so as to prevent particles from being carried away during the extraction process. It is also conceivable for the extraction process to be controlled by photoelectric cells installed in the recess 17, so that extraction will occur only when the electronic unit has been fitted in the recess, this being sensed by the photoelectric cells. In the event of a number of vacuum hoses having been connected to the vacuum pump, it is possible for the extraction to be regulated by means of flap valves controlled by the photoelectric cells. An oscilloscope may also conveniently be connected to the box via the contact device 24, as may a computer for the collection of data, all of which are of a previously disclosed type and do not appear in the drawings for this reason.

As can be appreciated from FIG. 2, the arrangement in accordance with the invention consitutes a measuring probe with a specific manner of securing the electronic unit. By incorporating an fastening device into the measuring probe and in this way utilizing negative pressure, it is possible to dispense with the traditional mechanical fixture. By securing the component by means of a vacuum, the dimensions of the holder are kept small, making it easier to perform simultaneous measurements on objects which are situated close to one another, and possibly even installed on the same circuit board, using a number of measurement rigs. This procedure is made possible by the introduction, into the hole 15 in the holder, of the tube 16 which opens with one of its ends into the recess 17 and projects with its other end from the holder, in which case the vacuum hose 19 is connected so that the fastening device is enclosed in this way by the measuring probe, the dimension of which is restricted in this way only by the number of measuring pins on the component for which it is adapted. The electronic unit, which may consist of an integrated circuit with connection leads, is fitted into the recess 17, which in this case functions as the vacuum fastening device, and is held securely against the recess, in conjunction with which the sealing ring 18 forms a seal between the external generated surface of the circuit board and the wall parts of the recess. The air extraction process is adapted in such a way that the negative pressure, which is produced in the recess once the circuit board has been fitted into the recess, holds the components securely in the holder 1, but that the components will release, without offering great resistance on being removed, for the purpose of replacing same.

The measuring of electronic units by means of the aforementioned, previously disclosed type of measuring probe is already familiar, for which reason only a summary description is given here. When the unit is held securely to the holder 1 by suction, the conical recesses 3 of the measuring pins 2 will come into contact with the measuring points on same, in so doing enabling the circuit to be measured. By providing the end parts of the measurement pins with the conical receses 3, a larger contact surface is afforded against the measuring points on the circuit board, in this way ensuring high measuring reliability. Any unevenness in the measuring surface can be compensated for by making the measuring pins spring-loaded. In order to prevent the signals from being conducted via the spring 7, in which case, for example, distortion of the result of the measurement could occur, the ball 5 is positioned between the end part of the spring and the oblique surface 4 of the measurement pin, so that it is forced against the oblique surface of the measurement pin at all times. The ball will thus always attempt to make its way downwards along the oblique surface in order to make contact against the internal generated surface of the sleeve 6, which in turn makes contact inside the cylinder 8 against its internal generated surface. The signal will thus be conducted through the ball and out into the sleeve and then on through the cylinder. The measuring pins are prevented from springing out of the cylinder by the shoulders 10 arranged on the measurement pins being forced against the end parts of the cylinders, in this way restricting the outward movement of the measuring pins. The cylinders, which are pressed into the holes 9 in the holder, are retained by the effect of compression.

The positioning of the measuring pins 2 in the holder 1 is adapted to suit the type of component which is to be measured. It is thus possible for several points of measurement to be measured at one and the same time. Perfect contact is achieved in this way between the measuring pins and the connection leads, and accordingly the risk of short-circuiting is eliminated.

The electrical adaptation between the measuring pins and the integrated circuit board is provided by means of the adapter circuit 12 fitted in the recess 11, said circuit being installed as close as possible to the measuring pins and the test object and being secured to the holder by means of the cover 14. The adapter circuit is well protected in this way, but is still easily accessible for replacement. The measuring probe can thus easily be adapted to suit the measurement task in question. Thanks to the short distance between the measuring pins and the test object, the time lag and any resulting distortion of the electrical signals can be minimized. Adaptation is very important, especially when the integrated circuit operates with short cycle times. Once the electrical signals have been adapted, these are transmitted further via the electrical cables 13 to the measuring instruments which are connected to the connection box.

The fact that the measurement rig is suspended from the arm 21 means that no load is imposed on the component which has been connected to it for measuring purposes and which is usually installed on a circuit board. The circuit board can be held securely whilst the measuring rig is moved forwards for the purpose of connecting it to the component, so that its fastening to the board is not placed under load. If the arm is placed in a particular position, it will remain in that position as a result of the friction between the respective articulated components until the arm is again moved. The operator uses the arm to bring the measuring probe roughly into position, whereupon the test probe is adjusted to the component by means of the hose 19. This adjustment involves positioning to within fine limits, which is made possible by the fact that the arm is terminated by the flexible hose 19 attached to the sleeve 20. The hose, which is made of a flexible material, can be extended for the purpose of performing measurements over a surface area of slightly more than 2 dm$^2$ thanks to the ability of the hose to swing through 360° without it being necessary to adjust the rough setting of the articulated arm. It is thus possible for a number of objects situated close to one another to be measured without having to adjust the arm.

There is thus available for each principal types of component a specially adapted measuring probe which is attached to the removable articulated arm and is equipped with a holder 1 and an adapter circuit 12 suitable for measuring purposes. It is thus a very simple matter to exchange the probe whenever a new type of component is to be measured. The arm is attached via the fastening element 22, preferably by means of some type of spring lock, to the connection box 23. The connection box in this case functions only as a branch connection between the measuring probe on the one hand and the necessary measuring instruments which are connected by means of the contact device 24 and the vacuum pump which is connected by means of the coupling 25 on the other hand.

As can be appreciated from the description, the arrangement in accordance with the invention is based on a novel method of holding the electronic unit securely to the holder by means of vacuum suction. The recess in the holder is adapted for this purpose so as to fit the special unit which is to be measured, in conjunction with which the measuring pins coincide precisely with the test object. The measuring pins are also spring-loaded so as to compensate for any unevenness. The holder is suspended from the articulated arm, by means of which rough positioning of the area of measurement is effected. By using a vacuum for fastening the unit to the holder, the latter is given small dimensions, which is necessary in view of the very high packing density on present-day circuit boards. Also afforded at the same time is the opportunity to perform measurements on adjacent test objects using a number of probes on one and the same occasion. The probes are also very easy to handle because no mechanical fixtues are required in order to hold the unit in position. For the purpose of checking-out board modules, a number of measuring probes can be connected to a data collecting system, when all the signals of interest can be measured and the output data can be read out via the computer. The risk of excessively high capacitances due to the lines leading to the test output is also eliminated.

The invention is not restricted to the illustrative embodiment described above and illustrated in the drawings, but may be modified within the scope of the patent claims following. It is thus possible, for example, to incorporate into the connection box the necessary measuring instruments such as an oscilloscope and a microcomputer capable of storing the measurement signals in a memory. For the purpose of measuring circuit boards with many types of components, it is possible for a head from which several measuring probes emerge to be fitted to a single arm.

I claim:

1. An apparatus for testing an electronic unit having a large number of connection points, said apparatus comprising:

holder means having a recess and at an edge of the recess a sealing member, the recess being adapted to receive the unit to be tested so that it rests against the sealing member;

spring-loaded contact elements on said holder means and located adjacent to, and outside of, the edge of the recess and positioned to be pressed against said connection points of the unit when the same is received in the recess;

a main body having a fixed position during the test; having connection means for measuring instruments for testing of said unit; and a connection to a vacuum source;

a tubular articulated member having one end attached to said main body and another end attached to said holder means, said member having a hollow inner space and being freely bendable three-dimensionally in space in order to give said holder means different positions in relation to said main body;

a number of cables extending along the tubular member and electrically connecting said spring-loaded contact elements of said holder means with a respective one of the connection means of said main body;

the inner space of said tubular member forming an air suction channel between said recess of said holder means and said connection of said main body for connection to said vacuum source.

2. An apparatus according to claim 1, in which said tubular member consists of an articulated arm comprising a large number of mutually articulated components.

* * * * *